US012622083B2

(12) United States Patent
Washio et al.

(10) Patent No.: US 12,622,083 B2
(45) Date of Patent: May 5, 2026

(54) LIGHT RECEIVING ELEMENT AND DISTANCE MEASURING DEVICE

(71) Applicant: SONY SEMICONDUCTOR SOLUTIONS CORPORATION, Kanagawa (JP)

(72) Inventors: Daisuke Washio, Nagasaki (JP); Masahiko Tsujita, Nagasaki (JP); Hidenori Maeda, Nagasaki (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 61 days.

(21) Appl. No.: 18/739,551

(22) Filed: Jun. 11, 2024

(65) Prior Publication Data

US 2024/0332337 A1     Oct. 3, 2024

Related U.S. Application Data

(63) Continuation of application No. 17/773,154, filed as application No. PCT/JP2020/015477 on Apr. 6, 2020, now Pat. No. 12,113,089.

(30) Foreign Application Priority Data

Nov. 6, 2019     (JP) ................................. 2019-201655

(51) Int. Cl.
H10F 39/00          (2025.01)

(52) U.S. Cl.
CPC ......... H10F 39/811 (2025.01); H10F 39/803 (2025.01); H10F 39/8057 (2025.01)

(58) Field of Classification Search
CPC ......... H01L 27/14636; H01L 27/14609; H01L 27/14623; H01L 27/14627;
(Continued)

(56) References Cited

U.S. PATENT DOCUMENTS

2009/0302406 A1     12/2009   Gambino et al.
2010/0214454 A1      8/2010   Kikuchi
(Continued)

FOREIGN PATENT DOCUMENTS

CN          103403869 A      11/2013
CN          103828354         5/2014
(Continued)

OTHER PUBLICATIONS

International Search Report and Written Opinion for International (PCT) Patent Application No. PCT/JP2020/015477, dated Sep. 8, 2020, 17 pages.

(Continued)

*Primary Examiner* — Tony Ko
(74) *Attorney, Agent, or Firm* — SHERIDAN ROSS P.C.

(57)          ABSTRACT

To prevent leakage of incident light from pixels around a pixel region of a light receiving element. A light receiving element includes a pixel region and an adjacent pixel. In the pixel region, a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer. The adjacent pixel is arranged adjacent to the pixel region and includes the photodiode, an on-chip lens having a curvature different from a curvature of the on-chip lens, and the wiring region.

20 Claims, 13 Drawing Sheets

(58) Field of Classification Search
CPC .......... H01L 27/14685; H01L 27/1464; H01L
27/14643; G01S 17/08
See application file for complete search history.

(56) References Cited

U.S. PATENT DOCUMENTS

| | | | |
|---|---|---|---|
| 2017/0077163 A1 | 3/2017 | Chou | |
| 2017/0338265 A1 | 11/2017 | Yoshiba et al. | |
| 2018/0197904 A1 | 7/2018 | Oh | |
| 2019/0043911 A1 | 2/2019 | Honda | |
| 2020/0066775 A1 | 2/2020 | Matsumoto | |
| 2021/0005646 A1* | 1/2021 | Sugiura | H10F 39/802 |
| 2022/0399390 A1 | 12/2022 | Washio et al. | |

FOREIGN PATENT DOCUMENTS

| | | | |
|---|---|---|---|
| CN | 104051484 | | 9/2014 |
| CN | 109273469 | | 1/2019 |
| CN | 208538863 | | 2/2019 |
| CN | 109643722 | A | 4/2019 |
| CN | 110291635 | | 9/2019 |
| CN | 114586160 | A | 6/2022 |
| JP | H07-221277 | | 8/1995 |
| JP | 2007080918 | A | 3/2007 |
| JP | 2007281375 | A | 10/2007 |
| JP | 2010186818 | A | 8/2010 |
| JP | 2011-165783 | | 8/2011 |
| JP | 2016-201797 | | 12/2016 |
| JP | 2017-191950 | | 10/2017 |
| JP | 2018201005 | A | 12/2018 |
| KR | 20110079336 | A | 7/2011 |
| WO | WO-2014156933 | A1 | 10/2014 |
| WO | WO 2018/173872 | | 9/2018 |
| WO | WO 2019/131122 | | 4/2019 |

OTHER PUBLICATIONS

Official Action for U.S. Appl. No. 17/773,154, dated Feb. 13, 2023, 5 pages. Restriction Requirement.

Ex Parte Quayle Action for U.S. Appl. No. 17/773,154, dated Jul. 7, 2023, 6 pages.

Notice of Allowance for U.S. Appl. No. 17/773,154, dated Nov. 30, 2023, 7 pages.

Notice of Allowance for U.S. Appl. No. 17/773,154, dated Mar. 21, 2024, 8 pages.

Corrected Notice of Allowance for U.S. Appl. No. 17/773,154, dated May 14, 2024, 2 pages.

* cited by examiner

LIGHT RECEIVING ELEMENT AND DISTANCE MEASURING DEVICE

CROSS REFERENCE TO RELATED APPLICATIONS

This application is a continuation of U.S. patent application Ser. No. 17/773,154, filed Apr. 29, 2022, which is a national stage application under 35 U.S.C. 371 and claims the benefit of PCT Application No. PCT/JP2020/015477, having an international filing date of Apr. 6, 2020, which designated the United States, which PCT application claimed the benefit of Japanese Priority Patent Application JP 2019-201655, filed Nov. 6, 2019, the entire disclosures of each contents of which are incorporated herein by reference.

TECHNICAL FIELD

The present disclosure relates to a light receiving element and a distance measuring device. More specifically, the present disclosure relates to a light receiving element including an avalanche photodiode and a distance measuring device that measures a distance to a target object using the light receiving element.

BACKGROUND ART

An imaging element and a light receiving element each configured by arranging a plurality of pixels having a photodiode for photoelectrically converting incident light formed on a semiconductor substrate have been used. By using such an image element, incident light can be detected for each pixel to generate an image signal, and a target object can be imaged. Furthermore, such an imaging element can be applied to a distance measuring device that measures a distance to a target object. In this distance measuring device, the distance can be measured by irradiating the target object with light, detecting reflection light reflected by the target object by a light receiving element, and measuring time from irradiation of the light to detection of the reflection light. By measuring the distance to the target object for each pixel, a three-dimensional shape of the target object can be obtained.

As such an imaging element, for example, a solid-state imaging device that separates pixels by an element separation region configured by embedding an insulating film in a groove formed in a region of a semiconductor substrate between pixels is used (for example, see PTL 1). This solid-state imaging device is configured as a back-illuminated imaging element in which incident light is applied to a back surface of a semiconductor substrate, and an on-chip lens is arranged close to the semiconductor substrate. By arranging the separation region between pixels, it is possible to block the light that passes through the on-chip lens of the adjacent pixel arranged close to and obliquely enters, thereby preventing the occurrence of crosstalk and color mixing. A plurality of pixels of the solid-state imaging device is arranged in a two-dimensional array to form a pixel region, and is arranged at a central portion of the semiconductor substrate.

CITATION LIST

Patent Literature

[PTL 1]
JP 2017-191950A

SUMMARY

Technical Problem

In the above-described related art, there is a problem that incident light from an end portion of the pixel region is mixed. In an imaging element, pixels that are not involved in generating an image signal are arranged between the pixel region and an end portion of the semiconductor substrate in order to ensure uniformity of each pixel in the pixel region. Such a pixel is called a dummy pixel, has the same configuration as a pixel in the pixel region, and is arranged adjacent to the pixel region. When the incident light that has passed through the dummy pixel is reflected by a wiring region or the like arranged on the front surface side of the semiconductor substrate and mixes with the pixel in the pixel region, noise such as flare occurs. For this reason, there is a problem that image quality is deteriorated. Furthermore, in the light receiving element used in a distance measuring device, an avalanche photodiode (APD) or a single photon avalanche diode (SPAD) is arranged in the pixel instead of the photodiode in order to improve the sensitivity. These are photodiodes whose sensitivity is increased by multiplying the charge generated by photoelectric conversion, and malfunction occurs due to leakage of incident light from dummy pixels.

The present disclosure has been made in view of the above-described problem, and it is desirable to prevent leakage of incident light from pixels around a pixel region.

Solution to Problem

According to a first embodiment of the present disclosure, there is provided a light receiving element including: a pixel region in which a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer; and an adjacent pixel arranged adjacent to the pixel region and including the photodiode, an on-chip lens having a curvature different from a curvature of the on-chip lens, and the wiring region.

Furthermore, in this first embodiment, an on-chip lens having a curvature smaller than a curvature of the on-chip lens of the pixel maybe be arranged in the adjacent pixel.

By adopting the first embodiment of the present disclosure, there is an effect that incident light is focused on a position of a semiconductor substrate different from a pixel in an adjacent pixel. Adjustment of the light focusing position is assumed.

Furthermore, according to a second embodiment of the present disclosure, there is provided a light receiving element including: a pixel region in which a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer; and an adjacent pixel arranged adjacent to the pixel region and including the photodiode, and a semiconductor region light-blocking wall formed on the semiconductor substrate at a boundary between the wiring region and the pixels adjacent to the wiring region and blocking the incident light.

Furthermore, in this second embodiment, in the adjacent pixel, the semiconductor region light-blocking wall may not be formed on a boundary different from the boundary with the pixel.

Furthermore, in this second embodiment, the semiconductor region light-blocking wall may be formed by arranging a material for blocking the incident light in a groove formed on the semiconductor substrate.

By adopting the second embodiment of the present disclosure, there is an effect that incident light to the pixel from the adjacent pixel on the semiconductor substrate is blocked by the semiconductor region light-blocking wall.

Furthermore, according to a third embodiment of the present disclosure, there is provided a light receiving element including: a pixel region in which a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer; and an adjacent pixel arranged adjacent to the pixel region and including the photodiode and the wiring region not having the wiring layer.

By adopting the third embodiment of the present disclosure, there is an effect that reflection of the incident light by the wiring layer of the adjacent pixel is removed.

Furthermore, according to a fourth embodiment of the present disclosure, there is provided a light receiving element including: a pixel region in which a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer; and an adjacent pixel arranged adjacent to the pixel region and including the wiring region having the photodiode, and a wiring layer arranged in the same layer as the wiring layer and formed to have a different size.

Furthermore, in this fourth embodiment, the adjacent pixel may include the wiring region having the wiring layer having a width smaller than a width of the wiring layer of the pixel.

Furthermore, in this fourth embodiment, the adjacent pixel may include the wiring region having a light-blocking wiring which is the wiring layer formed to have a shape covering the semiconductor substrate.

Furthermore, in this fourth embodiment, the adjacent pixel may further include a wall-shaped wall portion arranged between the light-blocking wiring and the semiconductor substrate at a boundary with an adjacent pixel of the pixels.

Furthermore, in this fourth embodiment, the adjacent pixel may include the wiring region having the wiring layer having a width larger than a width of the wiring layer of the pixel.

By adopting the fourth embodiment of the present disclosure, there is an effect that reflection of the incident light by the wiring layer of the adjacent pixel is adjusted.

Furthermore, according to a fifth embodiment of the present disclosure, there is provided a light receiving element including: a pixel region in which a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer; and an adjacent pixel arranged adjacent to the pixel region and including the photodiode, and a wiring region light-blocking wall arranged in the wiring region at a boundary between the wiring region and the pixels adjacent to the wiring region and blocking the incident light.

Furthermore, in this fifth embodiment, the wiring region light-blocking wall may include the wiring layer arranged at a boundary with an adjacent pixel of the pixels, and a wall-shaped wall portion arranged adjacently between the wiring layer and the semiconductor substrate.

Furthermore, in this fifth embodiment, the wiring region light-blocking wall may include a plurality of the wiring layers arranged in multiple layers at a boundary with an adjacent pixel of the pixels, and a wall-shaped interlayer wall portion arranged between layers of the plurality of the wiring layers.

By adopting the fifth embodiment of the present disclosure, there is an effect that reflection of the incident light by the wiring layer of the adjacent pixel is reduced.

Furthermore, according to a sixth embodiment of the present disclosure, there is provided a distance measuring device including: a pixel region in which a plurality of pixels is arranged, the plurality of pixels including a photodiode formed on a semiconductor substrate in which a charge generated by photoelectric conversion of incident light is multiplied with a high reverse bias voltage, the incident light being light emitted from a light source device and reflected from a target object, an on-chip lens that focuses the incident light on the photodiode, and a wiring region having a wiring layer connected to the photodiode and an insulating layer that insulates the wiring layer; an adjacent pixel arranged adjacent to the pixel region and including the photodiode, an on-chip lens having a curvature different from a curvature of the on-chip lens, and the wiring region; and a processing circuit that measures time from emission of light from the light source device until detection of a signal based on a current flowing through the photodiode transmitted by the wiring layer of the pixel to detect a distance to the target object.

By adopting the sixth embodiment of the present disclosure, there is an effect that incident light is focused on a position of a semiconductor substrate different from a pixel in an adjacent pixel. Adjustment of the light focusing position is assumed.

DESCRIPTION OF EMBODIMENTS

Figure 1:
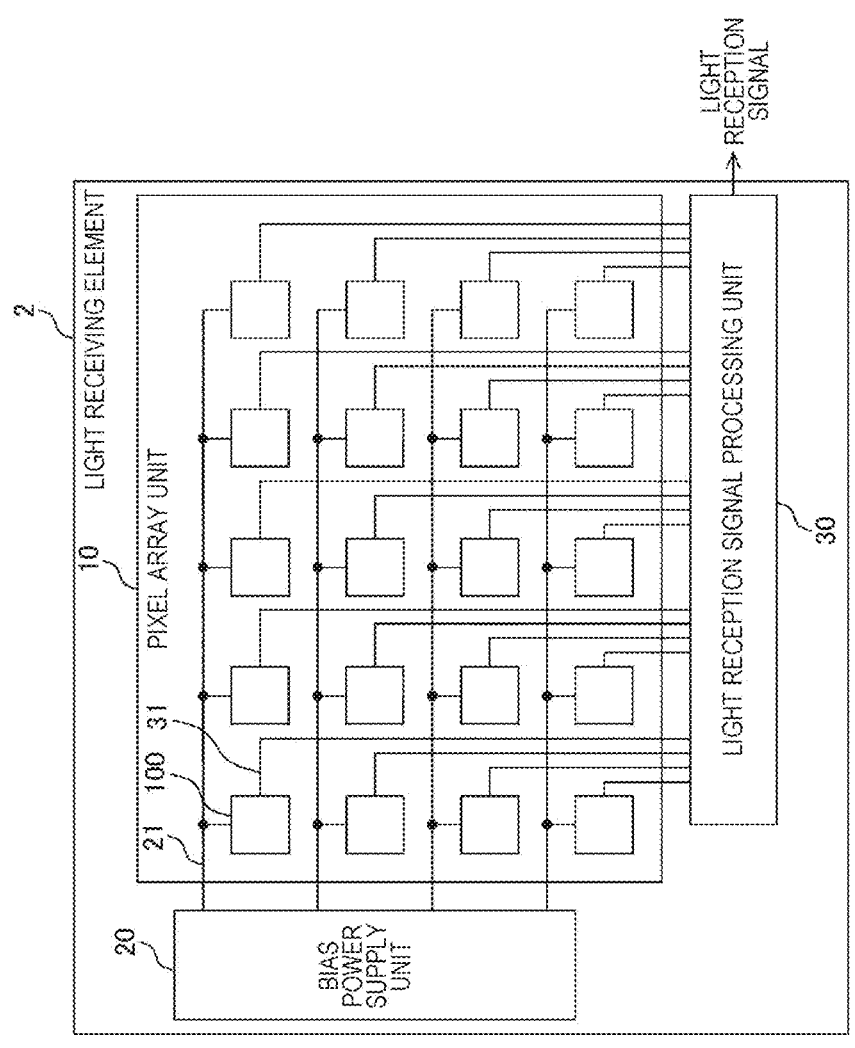
FIG. 1 is a diagram illustrating a configuration example of a light receiving element according to an embodiment of the present disclosure.

Next, an embodiment for implementing the present disclosure (hereinafter, referred to as an embodiment) will be described with reference to the drawings. In the drawings, the same or similar parts are denoted by the same or similar reference numerals. Furthermore, the embodiments will be described in the following order.

1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Ninth Embodiment 1. First Embodiment Configuration of Light Receiving Element FIG. 1 is a diagram illustrating a configuration example of a light receiving element according to an embodiment of the present disclosure. A light receiving element 2 in the drawing includes a pixel array unit 10, a bias power supply unit 20, and a light reception signal processing unit 30.

The pixel array unit 10 is configured by arranging a plurality of pixels 100 each having a photoelectric conversion unit that performs photoelectric conversion of incident light, in a two-dimensional lattice. The pixel 100 detects incident light and outputs a light reception signal as a detection result. For example, an avalanche photodiode, SPAD or the like can be employed for the photoelectric conversion unit. Hereinafter, it is assumed that a SPAD is arranged in the pixel 100 as a photoelectric conversion unit. Signal lines 21 and 31 are connected to each pixel 100. The signal line 21 is a signal line that supplies a bias voltage of the pixel 100. The signal line 31 is a signal line that transmits a light reception signal from the pixel 100. Note that although an example in which the pixels 100 are arranged in four rows and five columns is described in the pixel array unit 10 in the drawing, the number of pixels 100 arranged in the pixel array unit 10 is not limited.

The bias power supply unit 20 is a power supply that supplies a bias voltage to the pixel 100. The bias power supply unit 20 supplies a bias voltage via the signal line 21.

The light reception signal processing unit 30 processes light reception signals output from the plurality of pixels 100 arranged in the pixel array unit 10. The process of this light reception signal processing unit 30 corresponds to, for example, a process of detecting a distance to a target object on the basis of incident light detected by the pixel 100. Specifically, the light reception signal processing unit 30 can perform a distance detection process of a time of flight (ToF) method used in measuring a distance to a distant target object in an imaging device such as a vehicle-mounted camera. This distance detection process is processing of detecting a distance by irradiating a target object with light from a light source arranged in an imaging device, detecting light reflected by the target object, and measuring time that light from the light source reciprocates between the light source and the target object. A SPAD capable of high-speed light detection is employed for a device that performs such a distance detection process. Note that the light reception signal processing unit 30 is an example of a processing circuit described in the claims.

Configuration of Pixel Array Unit

Figure 2:
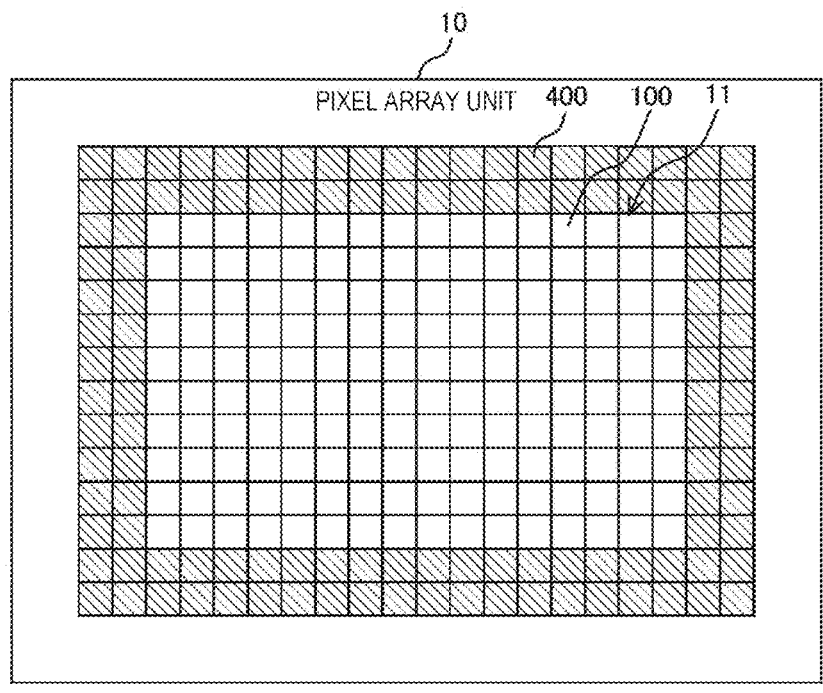
FIG. 2 is a diagram illustrating a configuration example of a pixel array unit according to an embodiment of the present disclosure.

FIG. 2 is a diagram illustrating a configuration example of a pixel array unit according to an embodiment of the present disclosure. The drawing is a diagram illustrating a configuration example of the pixel array unit 10. The pixel array unit 10 of the drawing includes a pixel region 11 and an adjacent pixel 400. Note that, in the drawing, a white rectangle represents the pixel 100, and a hatched rectangle represents the adjacent pixel 400.

The pixel region 11 is a region where the plurality of pixels 100 is arranged. The plurality of pixels 100 is arranged at the central portion of the semiconductor substrate on which the pixel array unit 10 is arranged.

The adjacent pixel 400 is a pixel arranged adjacent to the pixel region 11. This adjacent pixel 400 is arranged between the pixel region 11 and an end portion of the semiconductor substrate. The pixel 100 in the pixel region 11 detects incident light. On the other hand, the adjacent pixel 400 does not necessarily detect incident light even though it has the similar configuration to that of the pixel 100. The adjacent pixel 400 is a pixel arranged adjacent to the pixel region 11 in order to make the shape and the like of the pixel 100 arranged in the pixel region 11 uniform.

In a case where the adjacent pixel 400 is not arranged, the pixel 100 arranged at the outermost periphery of the pixel region 11 is likely to have a shape non-uniform with the pixel 100 arranged inside the pixel region 11. This is because, only three sides or two sides are adjacent to the pixel 100, and the periodicity of the shape of the pixel arranged is impaired as compared to the internal pixel 100 that is adjacent to the other pixels 100 at four sides, so that the shape changes during manufacturing. Therefore, by a configuration such that the adjacent pixels 400 are arranged adjacent to the pixel region 11 and the four sides of the pixel 100 arranged at the outermost periphery of the pixel region 11 are adjacent to other pixels, the shape and the like can be made uniform.

The pixel array unit 10 in the drawing represents an example in which two rows of adjacent pixels 400 are arranged around the pixel region 11.

Figure 3:
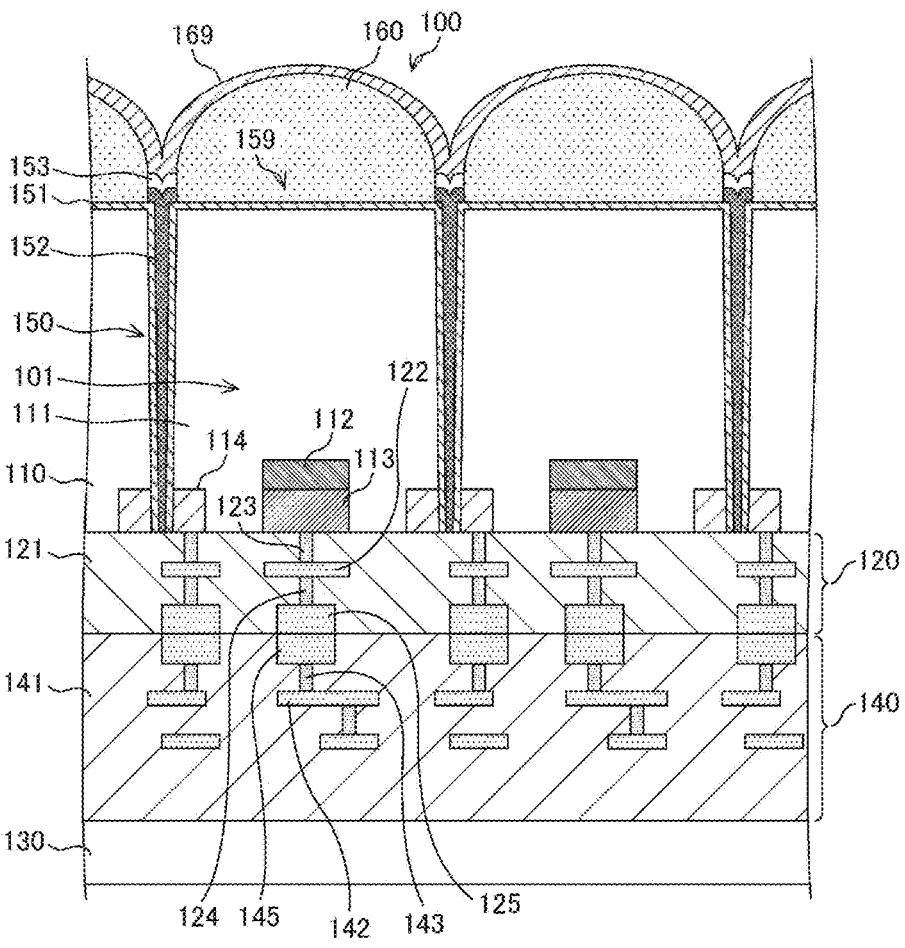
FIG. 3 is a diagram illustrating a configuration example of a pixel according to an embodiment of the present disclosure.

Pixel configuration FIG. 3 is a diagram illustrating a configuration example of a pixel according to an embodiment of the present disclosure. The drawing is a cross-sectional view representing a configuration example of the pixel 100. The pixel 100 includes semiconductor substrates 110 and 130, wiring regions 120 and 140, a semiconductor region light-blocking wall 152, insulating films 151 and 153, and an on-chip lens 160.

The semiconductor substrate 110 is a semiconductor substrate on which a diffusion region of an element such as a SPAD of the light receiving element 2 is arranged. The semiconductor substrate 110 can include, for example, silicon (Si). The diffusion region of the element can be formed by arranging a semiconductor region in a well region 111 formed on the semiconductor substrate 110. A SPAD 101 is arranged in the pixel 100 in the drawing. The SPAD 101 includes a well region 111 of the semiconductor substrate 110, an n-type semiconductor region 113, a p-type semiconductor region 112, and a p-type semiconductor region 114 arranged in the well region 111. The n-type semiconductor region 113 corresponds to a cathode, and forms a pn junction together with the p-type semiconductor region 112. A reverse bias voltage is applied to the pn junction via the well region 111 to form a depletion layer.

In the SPAD 101, photoelectric conversion is performed in the well region 111. When electrons of the charges generated by the photoelectric effect reach the depletion layer of the pn junction due to drift, the electrons are accelerated by the electric field based on the reverse bias voltage. In an avalanche photodiode, a reverse bias voltage near the breakdown voltage is applied. An electron avalanche is generated by the strong electric field due to the reverse bias voltage, and the number of charges increases. In the SPAD 101, a reverse bias voltage exceeding the breakdown voltage is applied. Electron avalanches occur continuously and the number of charges increases rapidly. Therefore, the SPAD 101 can detect the incidence of a single photon. By arranging the SPAD 101, a highly sensitive pixel 100 can be configured. The p-type semiconductor region 114 is a semiconductor region arranged adjacent to the well region 111 and constituting an anode. The p-type semiconductor region 114 is formed to have a shape surrounding the well region 111 near the n-type semiconductor region 113.

The wiring region 120 is a wiring region arranged on the front surface side of the semiconductor substrate 110. In this wiring region 120, a wiring layer 122 and an insulating layer 121 are arranged. The wiring layer 122 transmits a signal of the SPAD 101 and the like. This wiring layer 122 can include a metal such as copper (Cu). The insulating layer 121 insulates the wiring layer 122. This insulating layer 121 can include, for example, silicon oxide (SiO$_2$). Furthermore, in the wiring region 120, a contact plug 123 for connecting the semiconductor region of the semiconductor substrate 110 and the wiring layer 122 is further arranged. The semiconductor region 114 forming the anode of the SPAD 101 and the semiconductor region 113 forming the cathode of the SPAD 101 are connected to the wiring layer 122 by the contact plug 123. The contact plug 123 can include, for example, tungsten (W).

In the wiring region 120, a pad 125 and a via plug 124 are further arranged. The pad 125 is an electrode arranged on the surface of the wiring region 120. The pad 125 can include, for example, Cu. The via plug 124 connects the wiring layer 122 and the pad 125. This via plug 124 can include, for example, Cu.

The semiconductor substrate 130 is a semiconductor substrate bonded to the semiconductor substrate 110. On the semiconductor substrate 130, for example, a diffusion region of an element such as the light reception signal processing unit 30 described in FIG. 1 can be formed.

The wiring region 140 is a wiring region formed on the surface side of the semiconductor substrate 130, and includes a wiring layer 142 and an insulating layer 141. Furthermore, a pad 145 is arranged in the wiring region 140 and is connected to the wiring layer 142 by a via plug 143. When the semiconductor substrate 130 is bonded to the semiconductor substrate 110, the pad 145 and the pad 125 are joined. Signals can be exchanged between elements arranged on the semiconductor substrates 110 and 130 via the pad 145 and the pad 125.

The semiconductor region light-blocking wall 152 is arranged on the semiconductor substrate 110 at the boundary with the pixel 100 and blocks incident light. The semiconductor region light-blocking wall 152 is formed in a wall shape surrounding the pixel 100, and blocks incident light obliquely incident from the adjacent pixel 100. Therefore, the occurrence of crosstalk can be reduced. In the pixel region 11 described in FIG. 2, the semiconductor region light-blocking wall 152 is arranged in a lattice. The semiconductor region light-blocking wall 152 can be configured by embedding a light-blocking material such as a metal in a groove 150 formed through the semiconductor substrate 110.

Furthermore, the semiconductor region light-blocking wall 152 is formed to have a shape protruding toward the back surface side of the semiconductor substrate 110, and has an opening 159 arranged therein. The opening 159 can be formed in a circular shape in plan view. An on-chip lens 160 described later is arranged in the opening 159.

The insulating film 151 is a film that insulates the back surface of the semiconductor substrate 110. The insulating film 151 in the drawing is also arranged adjacent to the semiconductor substrate 110 on the side surface of the groove 150, and insulates the semiconductor substrate 110 and the semiconductor region light-blocking wall 152. This insulating film 151 can include, for example, SiO$_2$ or silicon nitride (SiN). Note that a fixed charge film for pinning may be arranged between the insulating film 151 and the semiconductor substrate 110. This fixed charge film can include aluminum oxide (Al$_2$O$_3$) or hafnium oxide (HfO$_2$).

The insulating film 153 is a film that is arranged on the surface of the semiconductor region light-blocking wall 152 and insulates the semiconductor region light-blocking wall 152. This insulating film 153 can include, for example, SiO$_2$.

The on-chip lens 160 is a lens that focuses incident light. The on-chip lens 160 is formed in a hemispherical shape, is arranged on the back surface of the semiconductor substrate 110, and focuses incident light on the well region 111 forming the SPAD 101. The on-chip lens 160 can include an inorganic material such as SiN or an organic material such as an acrylic resin.

An anti-reflection film 169 can be arranged on the surface of the on-chip lens 160. This anti-reflection film 169 is a film that prevents reflection of incident light from the surface of the on-chip lens 160. The anti-reflection film 169 can include, for example, SiO$_2$ or silicon oxynitride (SiON). The anti-reflection film 169 in the drawing is formed to have a shape covering the on-chip lens 160 and the insulating film 153.

Configuration of Adjacent Pixel

Figure 4:
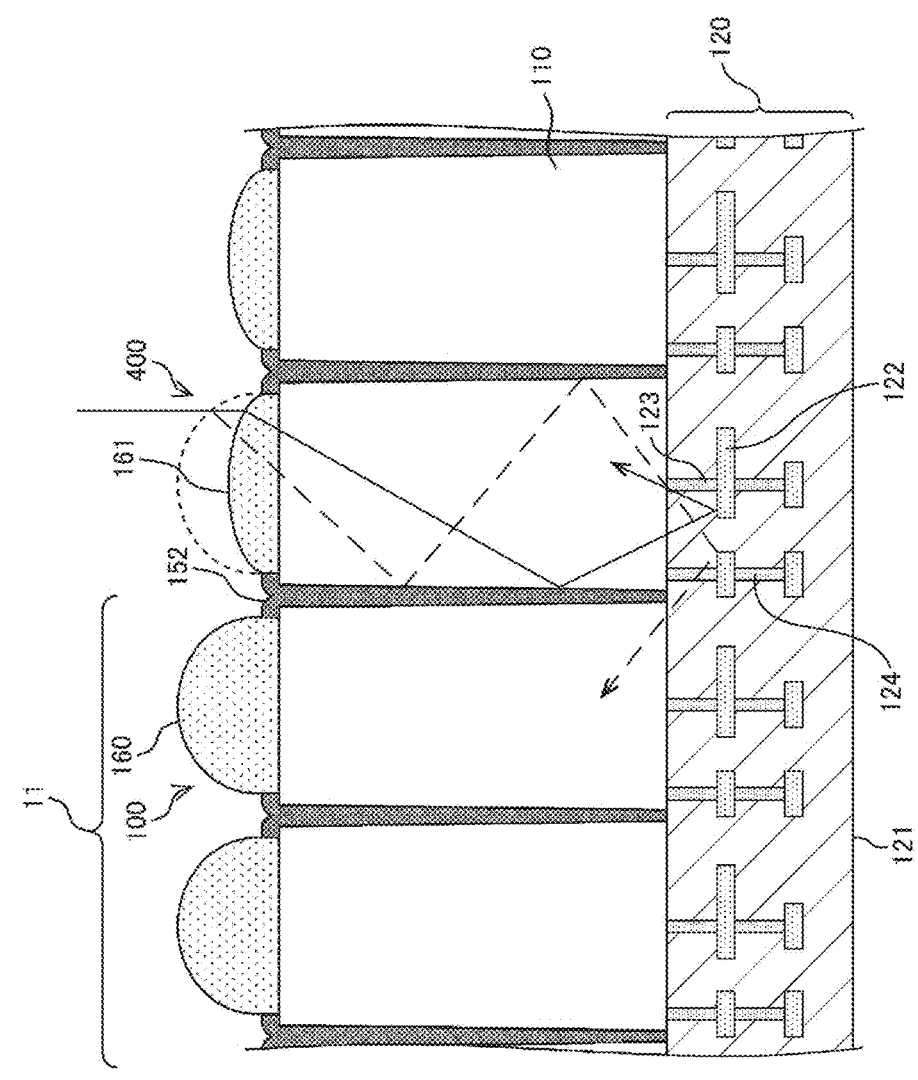
FIG. 4 is a diagram illustrating a configuration example of an adjacent pixel according to a first embodiment of the present disclosure.

FIG. 4 is a diagram illustrating a configuration example of an adjacent pixel according to a first embodiment of the present disclosure. The drawing is a cross-sectional view illustrating a configuration example of the adjacent pixel

400. Furthermore, the drawing also shows the pixel 100 arranged at an end portion of the pixel region 11. Note that the drawing is a diagram schematically illustrating the configuration of the pixel 100 and the adjacent pixel 400. Although illustration of a semiconductor region and the like of the semiconductor substrate 110 is omitted, a SPAD and the like are also arranged in the adjacent pixel 400. Furthermore, illustration of the anti-reflection film 169, the semiconductor substrate 130, and the wiring region 140 are omitted.

The adjacent pixel 400 in the drawing differs from the pixel 100 in that an on-chip lens 161 is provided instead of the on-chip lens 160. The on-chip lens 161 is an on-chip lens formed to have a curvature different from that of the on-chip lens 160. The on-chip lens 161 in the drawing has a hemispherical shape having a curvature smaller than a curvature of the on-chip lens 160. Therefore, the on-chip lens 161 focuses the incident light on the deep part of the semiconductor substrate. The dashed line illustrated in the adjacent pixel 400 in the drawing is based on the assumption that the on-chip lens 160 is arranged, and the dotted arrow represents the incident light focused by the on-chip lens 160. The incident light focused by the on-chip lens 160 having a high curvature is incident on the semiconductor substrate 110 at a large incident angle. In a case where this incident light is not absorbed by the semiconductor substrate 110, this incident light is reflected twice by the semiconductor region light-blocking wall 152 and is incident on the wiring region 120. Since the incident light is also incident on the wiring region 120 at a large incident angle, when this incident light is reflected by the wiring layer 122, this incident light is incident on the semiconductor substrate 110 of the pixel 100. For this reason, crosstalk, flare and the like occur.

On the other hand, since the on-chip lens 161 has a small curvature, incident light is incident on the semiconductor substrate 110 at a small incident angle. The solid line arrow in the drawing represents the incident light in the case of the on-chip lens 161. This incident light is reflected once by the semiconductor region light-blocking wall 152, is incident on the wiring region 120, and is reflected by the wiring layer 122. Since the incident angle on the wiring layer 122 is small, the reflected light is incident on the adjacent pixel 400 side. Therefore, occurrence of crosstalk can be reduced.

A method for manufacturing such an on-chip lens 161 will be described. As a method for manufacturing the on-chip lenses 160 and 161, a so-called hot melt flow method can be employed. This hot melt flow method is a manufacturing method in which a material resin of the on-chip lens 160 is melted and formed into a hemispherical shape.

[Method for Manufacturing On-Chip Lens]

Figure 5:
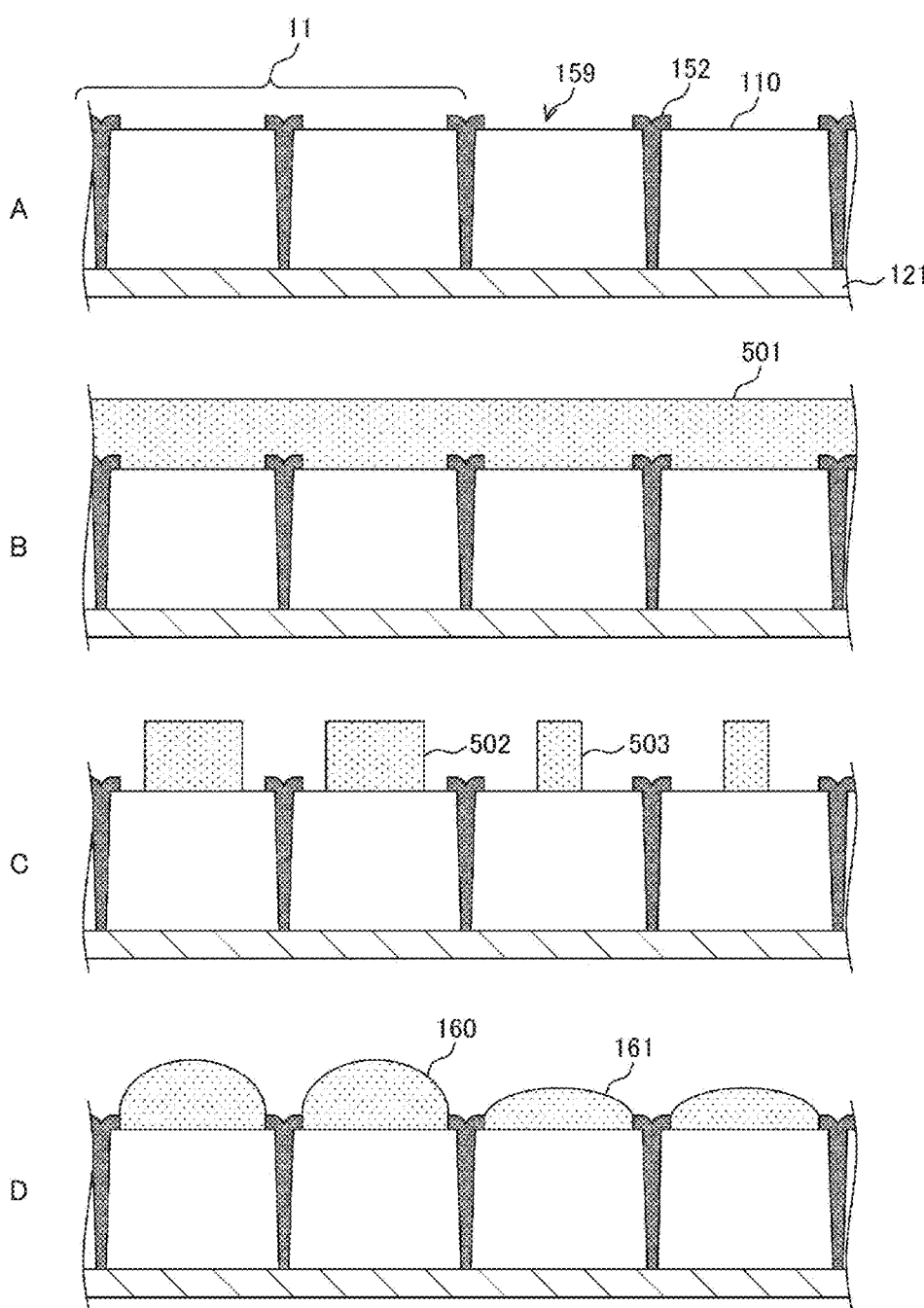
FIG. 5 is a diagram illustrating an example of a method for manufacturing an on-chip lens according to the first embodiment of the present disclosure.

FIG. 5 is a diagram illustrating an example of a method for manufacturing an on-chip lens according to the first embodiment of the present disclosure. The drawing is a diagram representing an example of a manufacturing process of the on-chip lenses 160 and 161. First, the groove 150 is formed in the semiconductor substrate 110. This can be formed, for example, by dry-etching the semiconductor substrate 110. Next, an insulating film 151 (not shown) is arranged on the back surface of the semiconductor substrate 110 including the groove 150. This can be performed, for example, by forming a film of an insulating material by sputtering or the like. Next, a metal film that is a material of the semiconductor region light-blocking wall 152 is arranged on the back surface of the semiconductor substrate 110 including the groove 150. This can be performed by sputtering. Next, a circular opening 159 is formed in the metal film by etching (A in the drawing).

Next, a resin film 501 that is a material of the on-chip lenses 160 and 161 is arranged on the back surface of the semiconductor substrate 110. For this resin film 501, an acrylic resin having photosensitivity can be used (B in the drawing).

Next, the resin film 501 is processed by lithography to generate cylindrical resin layers 502 and 503. The resin layer 502 is arranged in the opening 159 of the pixel 100. The resin layer 503 has a smaller volume than the resin layer 502, and is arranged in the opening 159 of the adjacent pixel 400 (C in the drawing).

Next, the semiconductor substrate 110 is heated by reflow or the like, and the resin layers 502 and 503 are heated to a temperature equal to or higher than the softening point. Therefore, the resin layers 502 and 503 melt and spread into the opening 159. At this time, the melted resin layers 502 and 503 are blocked by the end portion of the opening 159, and formed in a hemispherical shape due to surface tension. The resin layer 502 having a large volume changes to an on-chip lens 160 having a large curvature, and the resin layer 503 having a small volume changes to an on-chip lens 161 having a small curvature (D in the drawing). Through the above steps, the on-chip lens 161 can be manufactured.

Note that a so-called dry etching method can be adopted as a method for manufacturing the on-chip lens 161. In this dry etching method, a material film of the on-chip lenses 160 and 161 is arranged on the back surface of the semiconductor substrate 110, and a hemispherical resist is formed on the material film. Next, by dry-etching the resist and the on-chip lens material film under the resist, the shape of the resist is transferred to the on-chip lens material film, and an on-chip lens is formed. When an on-chip lens is formed by this dry etching method, the on-chip lens 160 is formed in the pixel 100, and the on-chip lens having the same shape as the on-chip lens 160 is arranged also in the adjacent pixel 400. Thereafter, the on-chip lens of the adjacent pixel 400 is ground and thinned while protecting the on-chip lens 160 of the pixel 100 with a resist or the like. Therefore, it is possible to form the on-chip lens 161 having a small curvature.

As described above, the light receiving element 2 according to the first embodiment of the present disclosure is configured such that the on-chip lens 161 having a small curvature is arranged in the adjacent pixel 400 arranged adjacent to the pixel region 11, so that leakage of incident light to the pixel 100 of the pixel region 11 can be reduced. Malfunction of the light receiving element 2 can be prevented.

2. Second Embodiment

In the light receiving element 2 of the above-described first embodiment, the on-chip lens 161 having a small curvature is arranged in the adjacent pixel 400. On the other hand, the light receiving element 2 according to a second embodiment of the present disclosure differs from the above-described first embodiment in that the on-chip lens of the adjacent pixel 400 is omitted.

Configuration of Adjacent Pixel

Figure 6:
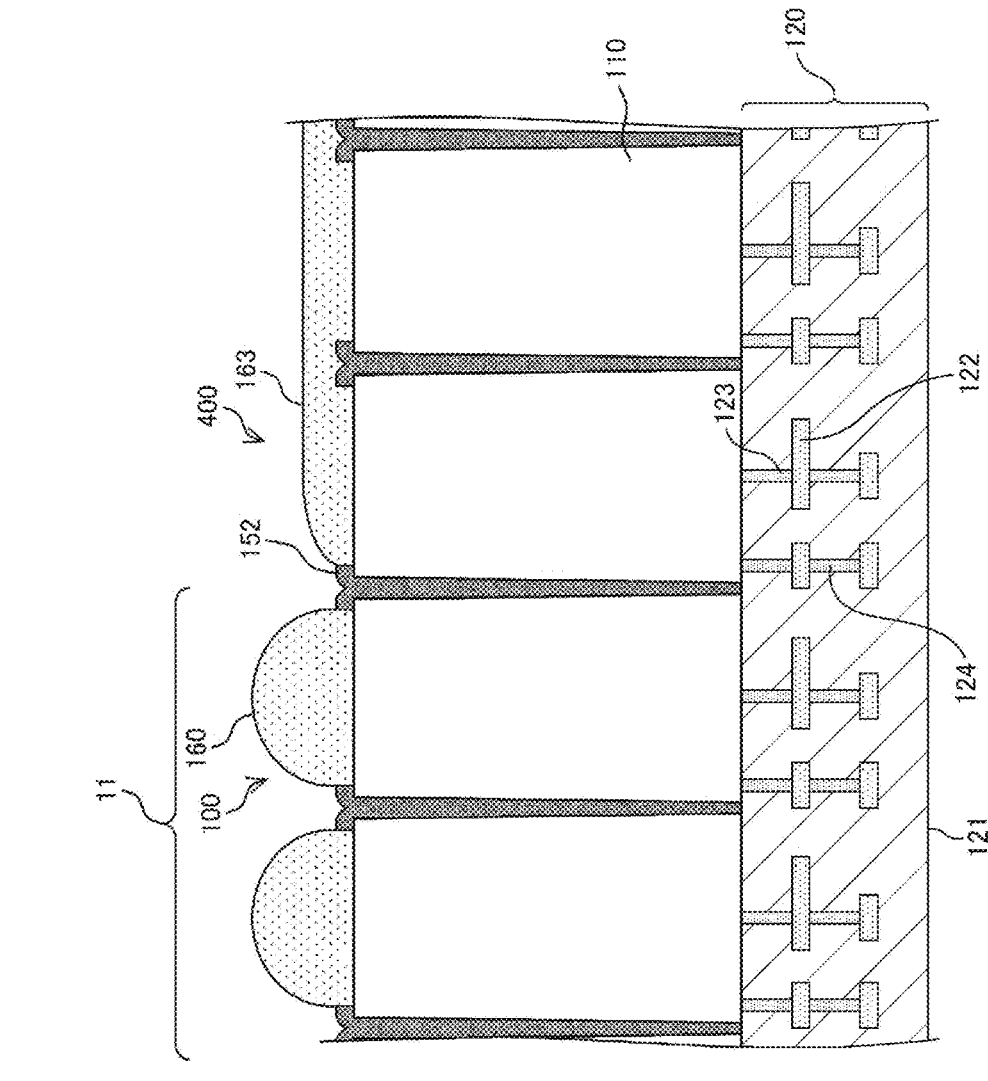
FIG. 6 is a diagram illustrating a configuration example of an adjacent pixel according to a second embodiment of the present disclosure.

FIG. 6 is a diagram illustrating a configuration example of an adjacent pixel according to the second embodiment of the present disclosure. The drawing is a diagram representing a configuration example of the adjacent pixel 400 as similar to FIG. 4. The adjacent pixel 400 in FIG. 6 *d* differs from the adjacent pixel 400 of FIG. 4 in that the on-chip lens 161 is not arranged in the adjacent pixel 400.

A protective film 163 is arranged, instead of the on-chip lens on the back surface of the semiconductor substrate 110 of the adjacent pixel 400 in the drawing. The protective film 163 is a film including the same material as that of the on-chip lens, and protects the back surface of the semiconductor substrate 110. Since no on-chip lens is arranged, the incident light of the adjacent pixel 400 is not focused and is incident on the semiconductor substrate 110 substantially perpendicularly. Therefore, the light passes through the semiconductor substrate 110 without being reflected by the semiconductor region light-blocking wall 152 and reaches the wiring region 120. In a case where the light is reflected by the wiring layer 122, the reflection light returns to the adjacent pixel 400, and incident light to the pixel 100 can be reduced. Note that the protective film 163 can be regarded as an on-chip lens having an extremely small curvature or an on-chip lens having a zero curvature. Note that, as similar to the on-chip lens 160, the anti-reflection film 169 can be also provided on the surface of the protective film 163.

The other configuration of the light receiving element 2 is similar to the configuration of the light receiving element 2 described in the first embodiment of the present disclosure, and thus a description thereof will not be repeated.

As described above, the light receiving element 2 according to the second embodiment of the present disclosure can further reduce leakage of incident light to the pixel 100 by omitting the on-chip lens of the adjacent pixel 400. Malfunction of the light receiving element 2 can be prevented.

3. Third Embodiment

Figure 7:
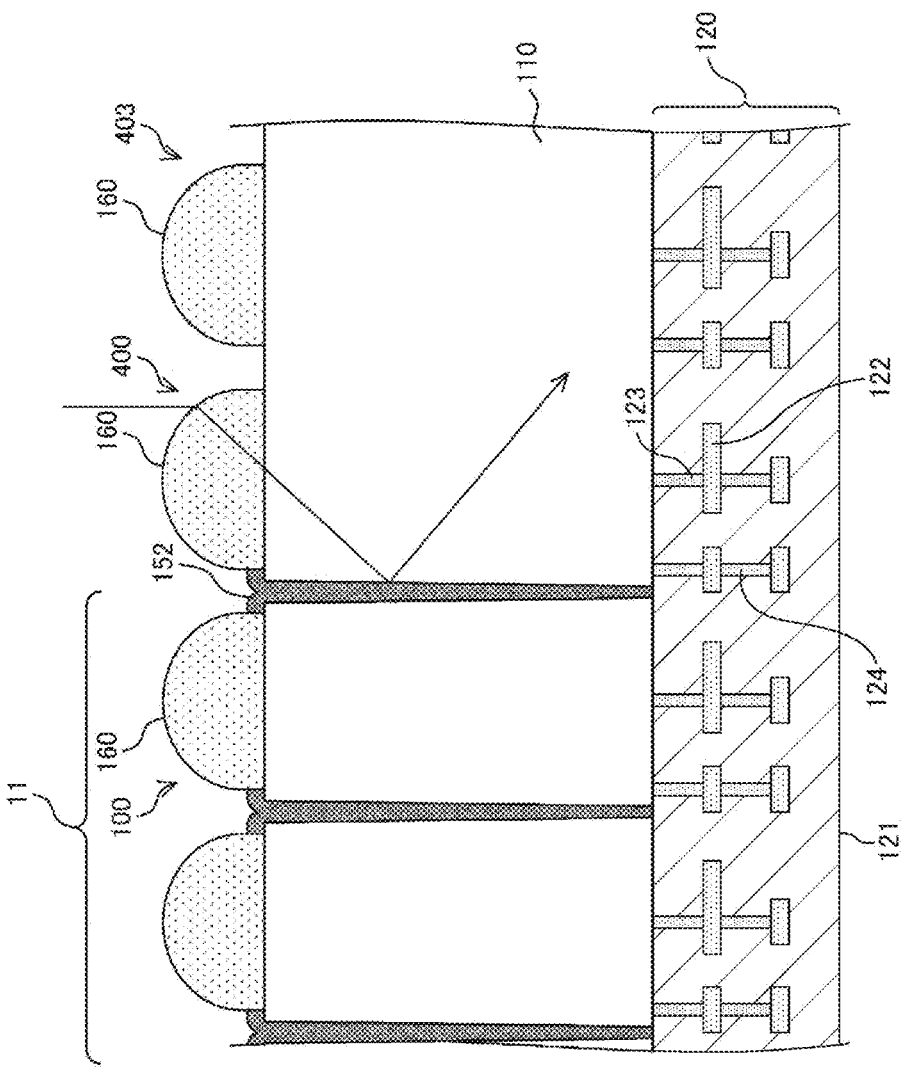
FIG. 7 is a diagram illustrating a configuration example of an adjacent pixel according to a third embodiment of the present disclosure.

In the light receiving element 2 of the above-described first embodiment, the semiconductor region light-blocking wall 152 is arranged around the adjacent pixel 400. On the other hand, the light receiving element 2 according to a third embodiment of the present disclosure differs from the above-described first embodiment in that the semiconductor region light-blocking wall is arranged at the boundary with the pixel 100 in the adjacent pixel 400.
Configuration of Adjacent Pixel FIG. 7 is a diagram illustrating a configuration example of an adjacent pixel according to the third embodiment of the present disclosure. The drawing is a diagram representing a configuration example of the adjacent pixel 400 as similar to FIG. 4. The adjacent pixel 400 in FIG. 7 differs from the adjacent pixel 400 in FIG. 2 in that the on-chip lens 160 is arranged in the adjacent pixel 400 instead of the on-chip lens 161 and the semiconductor region light-blocking wall 152 at the boundary between the adjacent pixels 400 is omitted.

An on-chip lens 160 having the same curvature is arranged in the pixel 100 and the adjacent pixel 400 in the drawing. Furthermore, the semiconductor region light-blocking wall 152 is arranged at the boundary between the pixel 100 and the adjacent pixel 400, and no semiconductor region light-blocking wall is arranged at the boundary between the adjacent pixels 400. That is, the semiconductor region light-blocking wall at a boundary other than the boundary with the pixel 100 in the adjacent pixel 400 is omitted. Therefore, as represented by the solid-line arrow in the drawing, the incident light reflected by the semiconductor region light-blocking wall 152 at the boundary with the pixel 100 travels straight away from the pixel region 11.

The other configuration of the light receiving element 2 is similar to the configuration of the light receiving element 2 described in the first embodiment of the present disclosure, and thus a description thereof will not be repeated.

As described above, the light receiving element 2 according to the third embodiment of the present disclosure is configured such that the semiconductor region light-block-ing wall at the boundary other than the boundary with the pixel 100 in the adjacent pixel 400 is omitted, so that the reflection light toward the pixel region 11 can be prevented. Malfunction of the light receiving element 2 can be prevented.

4. Fourth Embodiment

Figure 8:
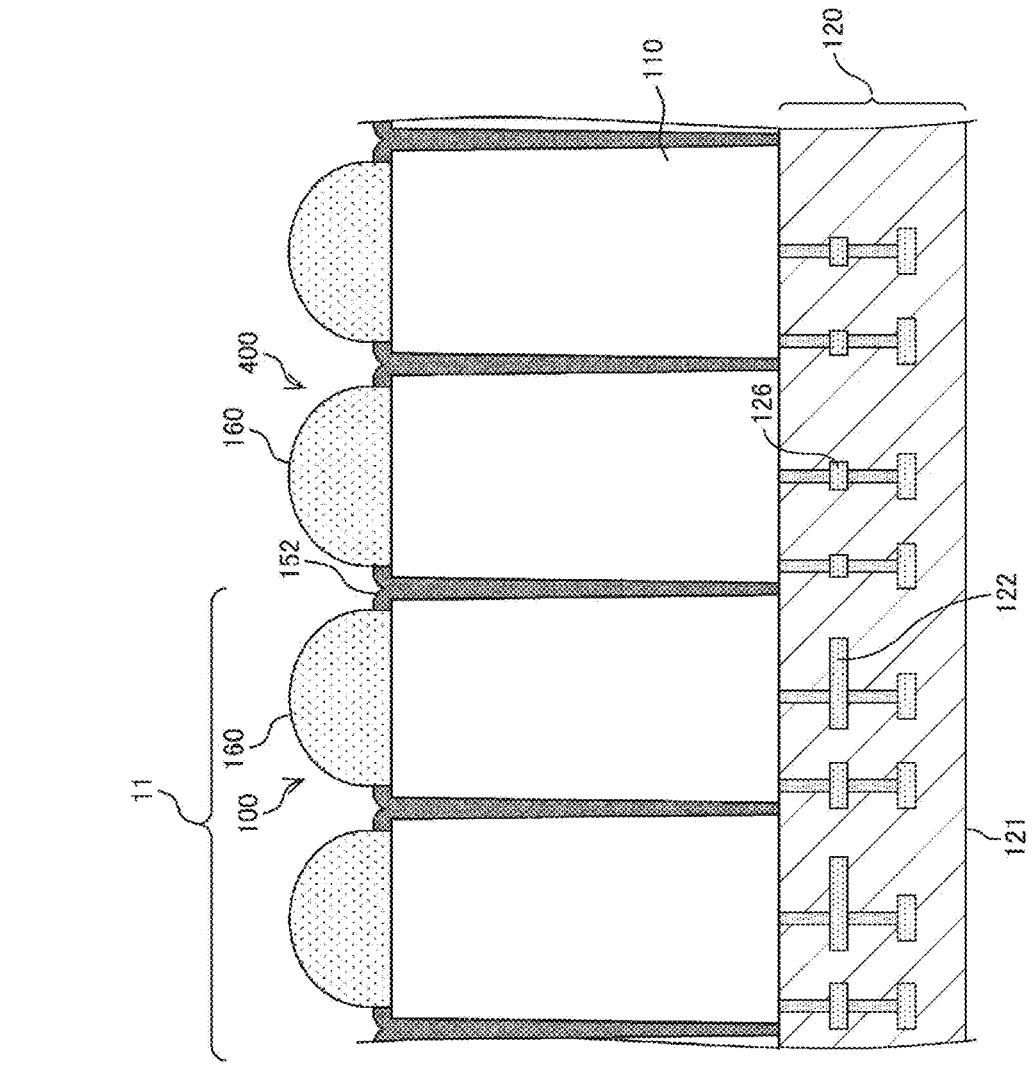
FIG. 8 is a diagram illustrating a configuration example of an adjacent pixel according to a fourth embodiment of the present disclosure.

In the light receiving element 2 of the above-described first embodiment, the wiring layer 122 is arranged in the wiring region 120. On the other hand, the light receiving element 2 according to a fourth embodiment of the present disclosure is different from the above-described first embodiment in that a wiring layer whose size is reduced is arranged in the adjacent pixel 400.
Configuration of Adjacent Pixel FIG. 8 is a diagram illustrating a configuration example of an adjacent pixel according to a fourth embodiment of the present disclosure. The drawing is a diagram representing a configuration example of the adjacent pixel 400 as similar to FIG. 4. The adjacent pixel 400 in FIG. 8 differs from the adjacent pixel 400 in FIG. 2 in that a wiring layer 126 is arranged instead of the wiring layer 122.

The wiring layer 126 is arranged in the adjacent pixel 400 in the drawing. This wiring layer 126 is a wiring layer having a different size from that of the wiring layer 122 arranged in the pixel 100. Specifically, the width of the wiring layer 126 is smaller than the width of the wiring layer 122. Note that the wiring layer 126 can be formed to have the same thickness as the wiring layer 122, and can be arranged in the same layer as the wiring layer 122. By reducing the width of the wiring layer 126, the area of the surface on which the incident light is incident is reduced, and the reflection light by the wiring layer 126 is reduced. Therefore, leakage of incident light to the pixel 100 is also reduced. On the other hand, by arranging the wiring layer 126 in the wiring region of the adjacent pixel 400, the wiring region of the pixel 100 at the end portion of the pixel region 11 can be formed uniformly, and the occurrence of voids and the like can be prevented.

The drawing represents an example in which the wiring layer 126 is arranged only in the lowermost layer of the wiring region 120 of the adjacent pixel 400. The arrangement of the wiring layer 126 is not limited to this example. For example, a wiring layer 126 having a smaller width than that of the wiring layer 122 can be arranged in all layers of the wiring region 120.

Note that the configuration of the adjacent pixel 400 is not limited to this example. For example, as compared to the wiring layer 122 of the pixel 100, the number of wiring layers arranged in the adjacent pixel 400 can be reduced. Furthermore, the wiring layer of the adjacent pixel 400 can be omitted.

The other configuration of the light receiving element 2 is similar to the configuration of the light receiving element 2 described in the first embodiment of the present disclosure, and thus a description thereof will not be repeated.

As described above, the light receiving element 2 according to the fourth embodiment of the present disclosure is configured such that the wiring layer 126 having a width smaller than a width of the wiring layer 122 of the pixel 100 is arranged in the adjacent pixel 400, so that leakage of incident light to the pixel 100 can be reduced. Malfunction of the light receiving element 2 can be prevented.

5. Fifth Embodiment

In the light receiving element 2 of the above-described first embodiment, the wiring layer 122 is arranged in the wiring region 120. On the other hand, the light receiving element 2 according to a fifth embodiment of the present disclosure differs from the above-described first embodiment in that a wiring layer covering the semiconductor substrate 110 is arranged in the adjacent pixel 400.

Configuration of Adjacent Pixel

Figure 9:
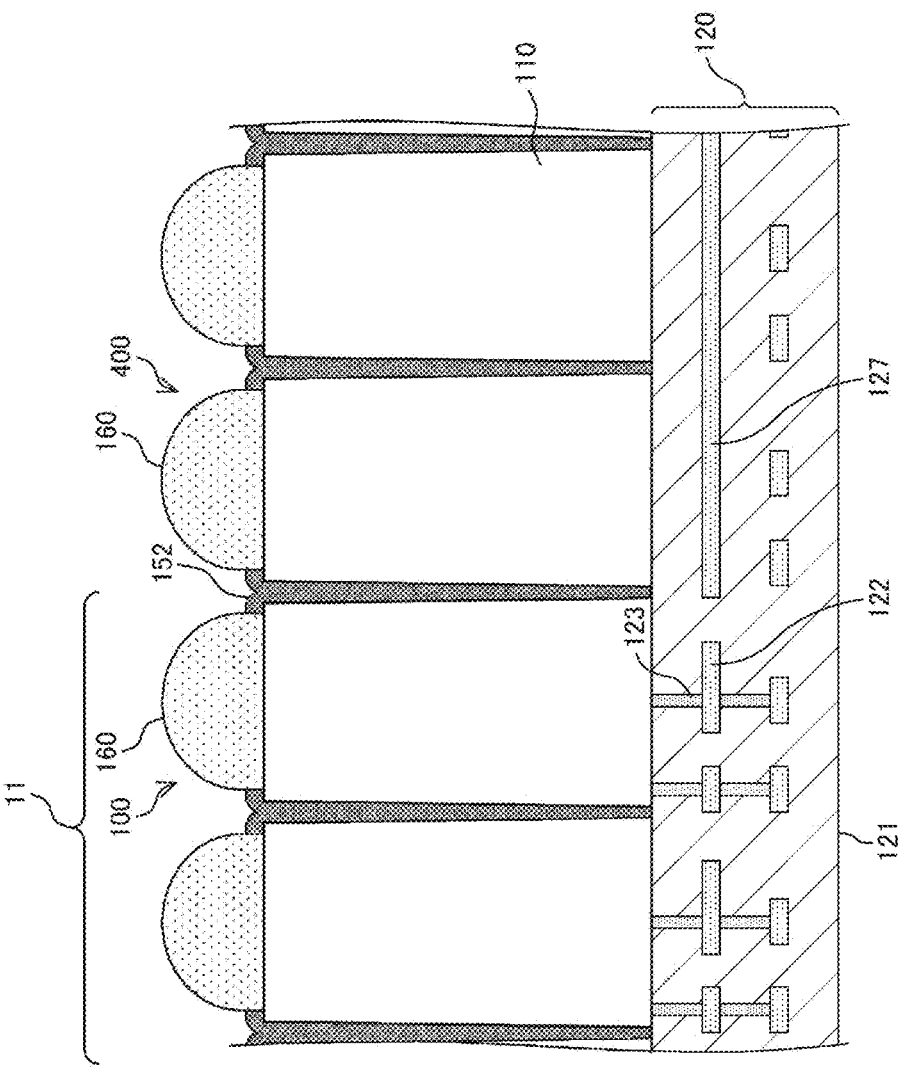
FIG. 9 is a diagram illustrating a configuration example of an adjacent pixel according to a fifth embodiment of the present disclosure.

FIG. 9 is a diagram illustrating a configuration example of an adjacent pixel according to the fifth embodiment of the present disclosure. The drawing is a diagram representing a configuration example of the adjacent pixel 400 as similar to FIG. 4. The adjacent pixel 400 in FIG. 9 differs from the adjacent pixel 400 in FIG. 2 in that a wiring layer 127 is provided.

The wiring layer 127 is arranged in the adjacent pixel 400 in the drawing. The wiring layer 127 is a wiring layer having a different size from that of the wiring layer 122 of the pixel 100, and is a wiring layer formed to have a shape covering the semiconductor substrate 110 in the adjacent pixel 400. By arranging the wiring layer 127, the surface side of the semiconductor substrate 110 is shielded from light, and leakage of incident light to the pixel 100 can be reduced. By arranging the wiring layer 127 close to the semiconductor substrate 110, the effect of light blocking can be improved. Although the drawing illustrates an example in which the wiring layer 127 is arranged in the same layer as the wiring layer 122 of the pixel 100, the wiring layer 127 may be arranged in a different position from the wiring layer 122. For example, the wiring layer 127 can be arranged at a position adjacent to the semiconductor substrate 110. Note that the wiring layer 127 is an example of the light-blocking wiring described in the claims.

Note that the configuration of the adjacent pixel 400 is not limited to this example. For example, a wiring layer having a width larger than a width of the wiring layer 122 can be arranged in the adjacent pixel 400. By arranging this large-width wiring layer 122 on the front surface side of the semiconductor substrate 110, the incidence of incident light on the adjacent pixel 400 to the wiring region 120 can be reduced.

Furthermore, instead of the wiring layer 127, a contact plug having a shape covering the semiconductor substrate 110 can be arranged in the adjacent pixel 400. Specifically, a light-blocking film in the form of a contact plug formed simultaneously with the contact plug 123 using the same material as that of the contact plug 123 can be arranged to shield light.

The other configuration of the light receiving element 2 is similar to the configuration of the light receiving element 2 described in the first embodiment of the present disclosure, and thus a description thereof will not be repeated.

As described above, the light receiving element 2 according to the fifth embodiment of the present disclosure is configured such that the wiring layer 127 is arranged in the adjacent pixel 400 to shield the front side of the semiconductor substrate 110 from light, so that leakage of incident light to the pixel 100 can be reduced. Malfunction of the light receiving element 2 can be prevented.

6. Sixth Embodiment

In the light receiving element 2 of the above-described fifth embodiment, the wiring layer 127 is arranged in the wiring region 120. On the other hand, the light receiving element 2 according to the sixth embodiment of the present disclosure differs from the above-described fifth embodiment in that the wall-shaped wall portion arranged between the wiring layer 127 and the semiconductor substrate 110 is further provided.

Configuration of Adjacent Pixel

Figure 10:
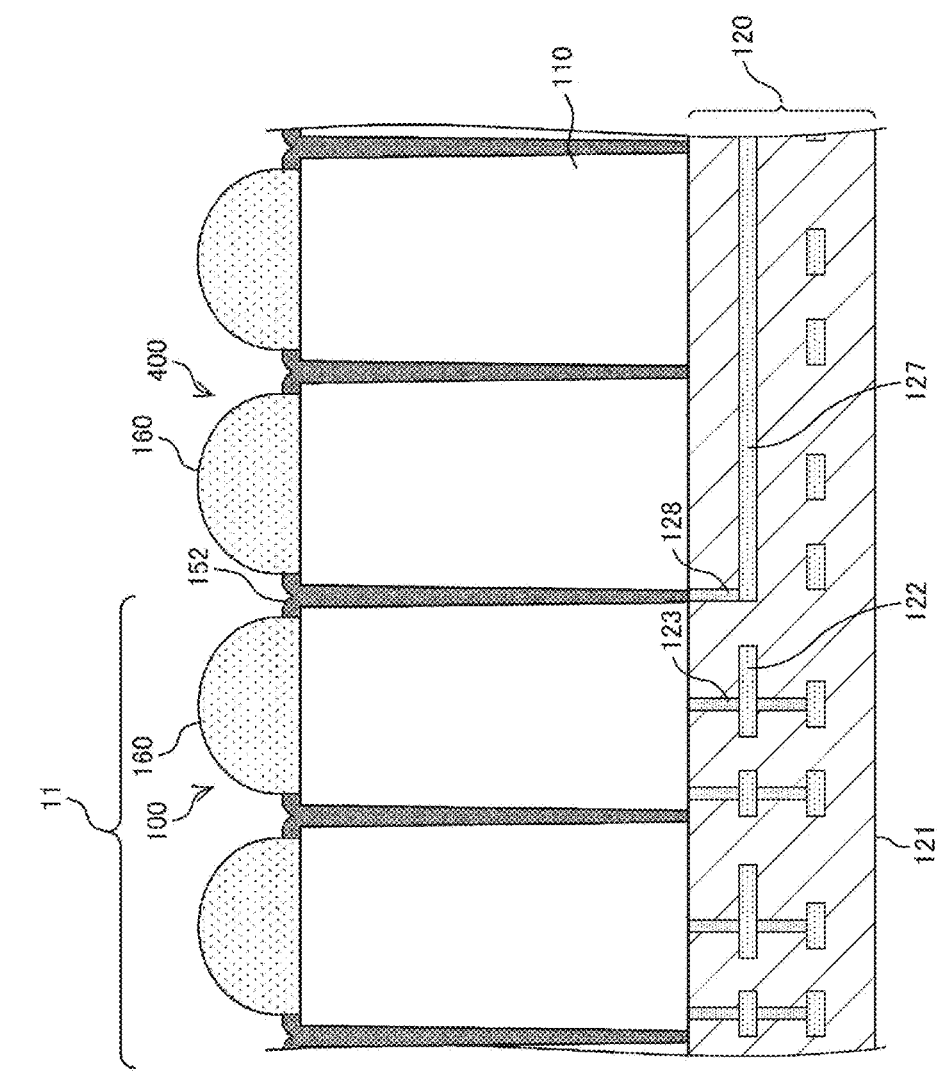
FIG. 10 is a diagram illustrating a configuration example of an adjacent pixel according to a sixth embodiment of the present disclosure.

FIG. 10 is a diagram illustrating a configuration example of an adjacent pixel according to the sixth embodiment of the present disclosure. The drawing is a diagram illustrating a configuration example of the adjacent pixel 400 as similar to FIG. 9. The adjacent pixel 400 in FIG. 10 differs from the adjacent pixel 400 in FIG. 9 is that the wall portion 128 is further arranged.

The wall portion 128 is formed in a wall shape for blocking incident light. The wall portion 128 is arranged between the wiring layer 127 and the surface of the semiconductor substrate 110 at the boundary between the pixel 100 and the adjacent pixel 400. The wall portion 128 can include a metal such as W, and can be formed simultaneously with the contact plug 123. By arranging the wall portion 128, a space between the wiring layer 127 and the surface of the semiconductor substrate 110 is shielded from light, and leakage of incident light to the pixel 100 can be further reduced.

The other configuration of the light receiving element 2 is similar to the configuration of the light receiving element 2 described in the fifth embodiment of the present disclosure, and thus a description thereof will not be repeated.

As described above, the light receiving element 2 according to the sixth embodiment of the present disclosure is configured such that the wall portion 128 is further arranged to shield the space between the wiring layer 127 and the semiconductor substrate 110 from light, so that leakage of incident light to the pixel 100 can be further reduced. Malfunction of the light receiving element 2 can be prevented.

7. Seventh Embodiment

In the light receiving element 2 of the above-described first embodiment, the semiconductor region light-blocking wall 152 is arranged on the semiconductor substrate 110 at the boundary between the pixel 100 and the adjacent pixel 400. On the other hand, the light receiving element 2 according to a seventh embodiment of the present disclosure is different from the above-described first embodiment in that the light-blocking wall is arranged also in the wiring region 120 at the boundary between the pixel 100 and the adjacent pixel 400.

Configuration of Adjacent Pixel

Figure 11:
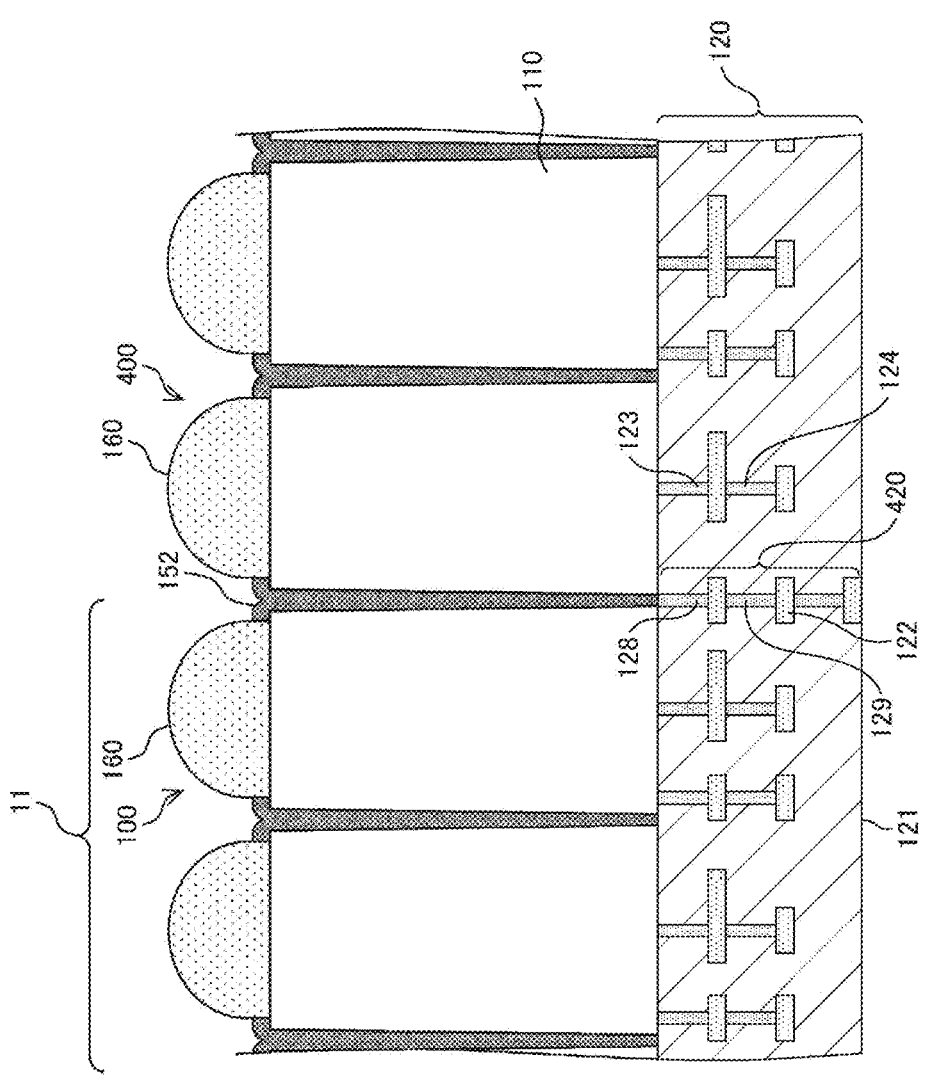
FIG. 11 is a diagram illustrating a configuration example of an adjacent pixel according to a seventh embodiment of the present disclosure.

FIG. 11 is a diagram illustrating a configuration example of an adjacent pixel according to the seventh embodiment of the present disclosure. The drawing is a diagram representing a configuration example of the adjacent pixel 400 as similar to FIG. 4. The adjacent pixel in FIG. 11 differs from the adjacent pixel 400 in FIG. 4 in that a wiring region light-blocking wall 420 is further arranged in the wiring region 120.

The wiring region light-blocking wall 420 is formed in a wall shape for blocking incident light. The wiring region light-blocking wall 420 can be formed by a multilayered wiring layer 122 arranged at the boundary between the pixel 100 and the adjacent pixel 400 and an interlayer wall portion 129 that is a wall-shaped wall portion arranged between layers of the wiring layer 122. The interlayer wall portion 129 can include a metal such as Cu and can be formed simultaneously with the via plug 124. Furthermore, the wall portion 128 described with reference to FIG. 10 can be arranged between the surface of the semiconductor substrate 110 and the wiring layer 122. By arranging the wiring region light-blocking wall 420, the wiring region 120 at the boundary between the pixel 100 and the adjacent pixel 400 is shielded from light, and leakage of incident light to the pixel 100 can be reduced.

Note that the configuration of the wiring region light-blocking wall 420 is not limited to this example. For example, the wiring region light-blocking wall 420 can be formed by the wiring layer 122 and the wall portion 128 arranged at the boundary between the pixel 100 and the adjacent pixel 400. Furthermore, the drawing illustrates a conceptual configuration of the adjacent pixel 400, and it is of course that the wiring region light-blocking wall 420 can be extended to the wiring region 140 described in FIG. 3. In this case, the pads 125 and 145 can be arranged at the boundary between the pixel 100 and the adjacent pixel 400.

The other configuration of the light receiving element 2 is similar to the configuration of the light receiving element 2 described in the first embodiment of the present disclosure, and thus a description thereof will not be repeated.

As described above, the light receiving element 2 according to the seventh embodiment of the present disclosure is configured such that the wiring region light-blocking wall 420 is further arranged in the wiring region 120 to shield the boundary with the pixel 100 from light, so that leakage of incident light to the pixel 100 can be further reduced. Malfunction of the light receiving element 2 can be prevented.

8. Eighth Embodiment

The circuit configuration of the pixel 100 arranged in the pixel array unit 10 according to the above-described embodiment will be described.

Figure 12:
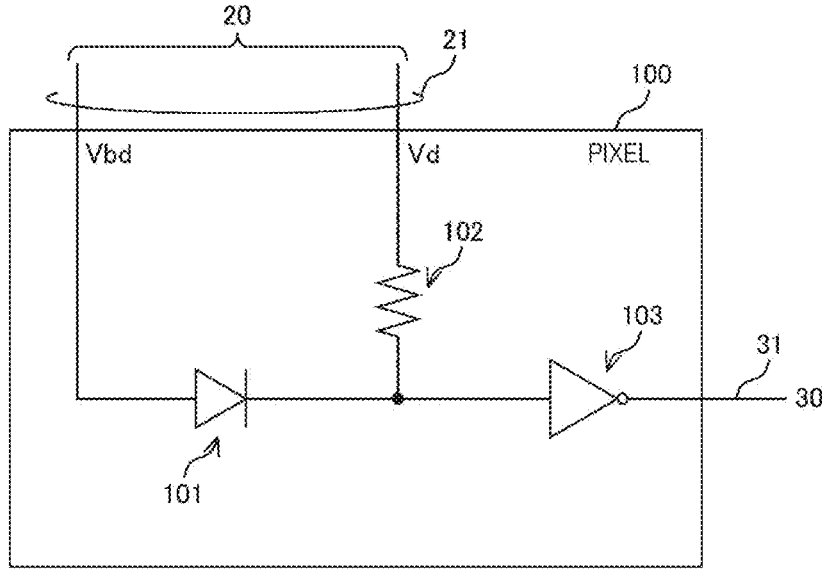
FIG. 12 is a circuit diagram illustrating a configuration example of a pixel according to an embodiment of the present disclosure.

Pixel configuration FIG. 12 is a circuit diagram illustrating a configuration example of a pixel according to an embodiment of the present disclosure. The drawing is a circuit diagram illustrating a configuration example of the pixel 100 described in FIG. 1. The pixel 100 of the drawing includes the SPAD 101, a resistor 102, and an inversion buffer 103. Furthermore, the signal line 21 in the drawing includes a signal line Vbd that applies a breakdown voltage of the SPAD 101 and a signal line Vd that supplies power for detecting a breakdown state of the SPAD 101.

The anode of SPAD 101 is connected to signal line Vbd. The SPAD 101 cathode is connected to one end of the resistor 102 and the input of the inversion buffer 103. The other end of the resistor 102 is connected to the signal line Vd. The output of the inversion buffer 103 is connected to the signal line 31.

A reverse bias voltage is applied to the SPAD 101 in the drawing by the signal line Vbd and the signal line Vd.

The resistor 102 is a resistor for performing quenching. This quenching is a process of returning the SPAD 101 in the breakdown state to the steady state. When the SPAD 101 enters the breakdown state due to the multiplication effect caused by the incidence of light, a sharp reverse current flows through the SPAD 101. This reverse current causes the terminal voltage of the resistor 102 to increase. Since the resistor 102 is connected in series with the SPAD 101, a voltage drop occurs due to the resistor 102, and the terminal voltage of the SPAD 101 becomes lower than a voltage capable of maintaining the breakdown state. Therefore, the SPAD 101 can be returned from the breakdown state to the steady state. Note that, instead of the resistor 102, a constant current circuit using a MOS transistor can be also used.

The inversion buffer 103 is a buffer that shapes a pulse signal based on the transition and return of the SPAD 101 to the breakdown state. The inversion buffer 103 generates a light reception signal based on the current flowing through the SPAD 101 according to the irradiated light, and outputs the light reception signal to the signal line 31.

9. Ninth Embodiment

Figure 13:
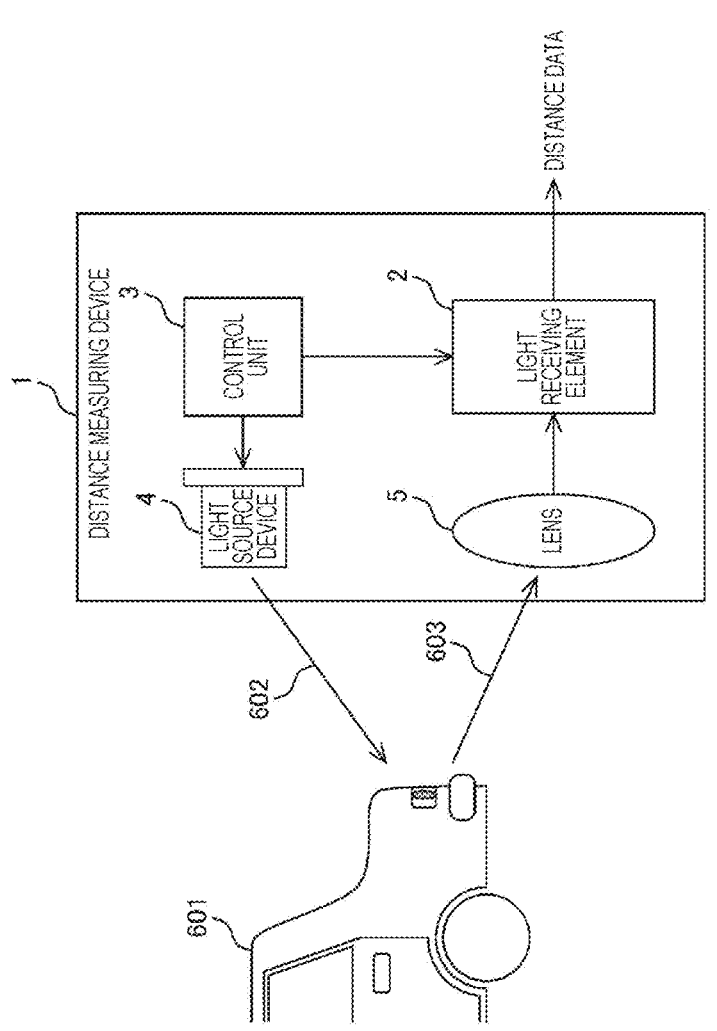
FIG. 13 is a diagram illustrating a configuration example of a distance measuring device according to an embodiment of the present disclosure.

The configuration of the distance measuring device 1 in which the light receiving element 2 of the above-described embodiment is arranged and measures the distance to the target will be described.
Configuration of Distance Measuring Device FIG. 13 is a diagram illustrating a configuration example of a distance measuring device according to an embodiment of the present disclosure. The drawing is a block diagram illustrating a configuration example of the distance measuring device 1 using the light receiving element 2 described in FIG. 1. The distance measuring device 1 in the drawing includes the light receiving element 2, a control unit 3, a light source device 4, and a lens 5. Note that the drawing shows a target object 601 for distance measurement.

The light source device 4 emits light to a target object for distance measurement. As the light source device 4, for example, a laser light source that emits infrared light can be employed.

The control unit 3 controls the entire distance measuring device 1. Specifically, the control unit 3 controls the light source device 4 to emit emission light 602 to the target object 601 and notifies the light receiving element 2 of the start of the emission. The light receiving element 2 notified of the emission of the emission light 602 detects reflection light 603 from the target object 601, measures the time from the emission of the emission light 602 to the detection of the reflection light 603, and measures the distance to the target object 601. The measured distance is output to the outside of the distance measuring device 1 as distance data.

Note that the configuration of the first embodiment may be combined with the light receiving element 2 of another embodiment. Specifically, the on-chip lens 161 in FIG. 4 can be applied to the light receiving element 2 in FIGS. 7 to 11.

Furthermore, the configuration of the second embodiment may be combined with the light receiving element 2 of another embodiment. Specifically, the protective film 163 in FIG. 6 can be applied to the light receiving element 2 in FIGS. 7 to 11.

Furthermore, the configuration of the third embodiment may be combined with the light receiving element 2 of another embodiment. Specifically, in the light receiving element 2 of FIGS. 4, 6 and 8 to 11, the semiconductor region light-blocking wall at the boundary other than the boundary with the pixel 100 in the adjacent pixel 400 can be omitted.

Furthermore, the configuration of the fourth embodiment may be combined with the light receiving element 2 of another embodiment. Specifically, the wiring layer 126 in FIG. 8 can be applied to the light receiving element 2 in FIGS. 4, 6, 7, and 11.

Furthermore, the configuration of the fifth embodiment may be combined with the light receiving element 2 of another embodiment. Specifically, the wiring layer 127 in FIG. 9 can be applied to the light receiving element 2 in FIGS. 4, 6, 7, and 11.

Furthermore, the configuration of the seventh embodiment may be combined with the light receiving element 2 of another embodiment. Specifically, the wiring region light-blocking wall 420 in FIG. 11 can be applied to the light receiving element 2 in FIGS. 4 and 6 to 10.

Lastly, the description of each of the above-described embodiments is an example of the present disclosure, and the present disclosure is not limited to the above-described embodiments. For this reason, it is of course that various modifications can be made according to the design and the like, other than the above-described embodiments, as long as the modifications do not depart from the technical idea according to the present disclosure.

Furthermore, the effects described in the present specification are merely examples and are not intended to be limiting. Furthermore, other effects may be provided.

Furthermore, the drawings in the above-described embodiments are schematic, and the dimensional ratios and the like of the respective parts do not necessarily match actual ones. Furthermore, it is of course that dimensional relationships and ratios are different between drawings.

Note that, the present technology can also adopt the following configuration.

(1) A light receiving element including:

a pixel region in which a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer; and an adjacent pixel arranged adjacent to the pixel region and including the photodiode, an on-chip lens having a curvature different from a curvature of the on-chip lens, and the wiring region.

(2) The light receiving element according to (1), in which an on-chip lens having a curvature smaller than a curvature of the on-chip lens of the pixel is arranged in the adjacent pixel.

(3) A light receiving element including:

a pixel region in which a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer; and an adjacent pixel arranged adjacent to the pixel region and including the photodiode, and a semiconductor region light-blocking wall formed on the semiconductor substrate at a boundary between the wiring region and the pixels adjacent to the wiring region and blocking the incident light.

(4) The light receiving element according to (3), in which the semiconductor region light-blocking wall is not formed on a boundary different from a boundary with the pixel.

(5) The light receiving element according to (3) or (4), in which the semiconductor region light-blocking wall is formed by arranging a material that blocks the incident light in a groove formed in the semiconductor substrate.

(6) A light receiving element including:

a pixel region in which a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer; and an adjacent pixel arranged adjacent to the pixel region and including the photodiode and the wiring region not having the wiring layer.

(7) A light receiving element including:

a pixel region in which a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer; and an adjacent pixel arranged adjacent to the pixel region and including the wiring region having the photodiode, and a wiring layer arranged in a same layer as the wiring layer and formed to have a different size.

(8) The light receiving element according to (7), in which the adjacent pixel includes the wiring region having the wiring layer having a width smaller than a width of the wiring layer of the pixel.

(9) The light receiving element according to (7), in which the adjacent pixel includes the wiring region having a light-blocking wiring which is the wiring layer formed to have a shape covering the semiconductor substrate.

(10) The light receiving element according to (9), in which the adjacent pixel further includes a wall-shaped wall portion arranged between the light-blocking wiring and the semiconductor substrate at a boundary with an adjacent pixel of the pixels.

(11) The light receiving element according to (7), in which the adjacent pixel includes the wiring region having the wiring layer having a width larger than a width of wiring layer of the pixel.

(12) A light receiving element including:

a pixel region in which a plurality of pixels is arranged, the plurality of pixels including a photodiode formed on a semiconductor substrate in which a charge generated by photoelectric conversion of incident light is multiplied with a high reverse bias voltage, an on-chip lens that focuses the incident light on the photodiode, and a wiring region having a wiring layer connected to the photodiode and an insulating layer that insulates the wiring layer; and an adjacent pixel arranged adjacent to the pixel region and including the photodiode, and a wiring region light-blocking wall arranged in the wiring region at a boundary between the wiring region and the pixels adjacent to the wiring region and blocking the incident light.

(13) The light receiving element according to (12), in which the wiring region light-blocking wall includes the wiring layer arranged at a boundary with an adjacent pixel of the pixels, and a wall-shaped wall portion arranged adjacently between the wiring layer and the semiconductor substrate.

(14) The light receiving element according to (12) or (13), in which the wiring region light-blocking wall includes a plurality of the wiring layers arranged in multiple layers at a boundary with an adjacent pixel of the pixels, and a wall-shaped interlayer wall portion arranged between layers of the plurality of the wiring layers.

(15) A distance measuring device including:

a pixel region in which a plurality of pixels is arranged, the plurality of pixels including a photodiode formed on a semiconductor substrate in which a charge generated by photoelectric conversion of incident light, is multiplied with a high reverse bias voltage, the incident light being light emitted from a light source device and reflected from a target object, an on-chip lens that focuses the incident light on the photodiode, and a wiring region having a wiring layer connected to the photodiode and an insulating layer that insulates the wiring layer;

an adjacent pixel arranged adjacent to the pixel region and including the photodiode, an on-chip lens having a curvature different from a curvature of the on-chip lens, and the wiring region; and a processing circuit that measures time from emission of light from the light source device until detection of a signal based on a current flowing through the photodiode transmitted by the wiring layer of the pixel to detect a distance to the target object.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Distance measuring device
2 Light emitting element
10 Pixel array unit
11 Pixel region
30 Light reception signal processing unit
100 Pixel
101 SPAD
110, 130 Semiconductor substrate
120, 140 Wiring region
121, 141 Insulating layer
122, 126, 127, 142 Wiring layer
123 Contact plug
124, 143 Via plug
125, 145 Pad
128 Wall portion
129 Interlayer wall
150 Groove
151 Insulating film
152 Semiconductor region light-blocking wall
159 Opening
160, 161 On-chip lens
163 Protective film
169 Anti-reflection film
400 Adjacent pixel
420 Wiring region light-blocking wall

What is claimed is:

1. A light receiving device, comprising:

a first semiconductor substrate, including:

a first plurality of pixels disposed in a pixel region, wherein each pixel of the first plurality of pixels includes:

an avalanche photodiode disposed in the first semiconductor substrate, and an on-chip lens, wherein the on-chip lens is disposed on a first side of the first semiconductor substrate, a second plurality of pixels disposed in a region other than the pixel region, each pixel of the second plurality of pixels including:

an avalanche photodiode disposed in the first semiconductor substrate, and a separation region disposed in the first semiconductor substrate; and a first wiring layer, wherein the first wiring layer is disposed on a second side of the first semiconductor substrate, and wherein the separation region is disposed at a boundary between the pixel region and the region other than the pixel region.

2. The light receiving device according to claim 1, further comprising:

a second wiring layer; and a second semiconductor substrate, wherein the first semiconductor substrate and the second semiconductor substrate are coupled to one another through the first and second wiring layers.

3. The light receiving device according to claim 1, wherein the separation region includes a metal.

4. The light receiving device according to claim 1, wherein the separation region is a light-blocking wall.

5. The light receiving device according to claim 4, wherein the light-blocking wall extends from the first side of the first semiconductor substrate to the second side of the first semiconductor substrate.

6. The light receiving device according to claim 4, further comprising:

an insulating film, wherein the insulating film is disposed on a surface of the light-blocking wall.

7. The light receiving device according to claim 6, wherein the insulating film is Silicon Oxide.

8. The light receiving device according to claim 4, wherein in the second plurality of pixels, the light-blocking wall is not formed on a boundary different from the boundary between the pixel region and the region other than the pixel region.

9. The light receiving device according to claim 1, wherein a first width of the separation region at the first side of the first semiconductor substrate is greater than a second width of the separation region at the second side of the first semiconductor substrate.

10. The light receiving device according to claim 1, wherein each pixel of the second plurality of pixels includes an on-chip lens.

11. The light receiving device according to claim 10, wherein a height of the on-chip lens of each pixel of the first plurality of pixels is greater than a height of the on-chip lens of each pixel of the second plurality of pixels.

12. The light receiving device according to claim 10, wherein a height of the on-chip lens of each pixel of the first plurality of pixels is equal to a height of the on-chip lens of each pixel of the second plurality of pixels.

13. The light receiving device according to claim 10, wherein the separation region is a light-blocking wall.

14. The light receiving device according to claim 13, wherein the light-blocking wall extends from the first side of the first semiconductor substrate to the second side of the first semiconductor substrate.

15. The light receiving device according to claim 13, wherein in the second plurality of pixels, the light-blocking wall is not formed on a boundary different from the boundary between the pixel region and the region other than the pixel region.

16. The light receiving device of claim 13, wherein a first width of the separation region at first side of the first semiconductor substrate is greater than a second width of the separation region at the second side of the first semiconductor substrate.

17. The light receiving device according to claim 13, further comprising:

a second wiring layer; and a second semiconductor substrate, wherein the first semiconductor substrate and the second semiconductor substrate are coupled to one another through the first and second wiring layers.

18. The light receiving device according to claim 1, wherein the pixel region includes a two-dimensional array of the first plurality of pixels, and wherein the region other than the pixel region surrounds the pixel region.

19. The light receiving device according to claim 18, wherein the region other than the pixel region is disposed between the pixel region and end portion s of the first semiconductor substrate.

20. A distance measuring device, comprising:

a light receiving device, including:

a first semiconductor substrate, including:

a first plurality of pixels disposed in a pixel region, wherein each pixel of the first plurality of pixels includes:

an avalanche photodiode disposed in the first semiconductor substrate, and an on-chip lens, wherein the on-chip lens is disposed on a first side of the first semiconductor substrate, a second plurality of pixels disposed in a region other than the pixel region, each pixel of the second plurality of pixels including:

an avalanche photodiode disposed in the first semiconductor substrate, and a separation region disposed in the first semiconductor substrate; and a first wiring layer, wherein the first wiring layer is disposed on a second side of the first semiconductor substrate, and wherein the separation region is disposed at a boundary between the pixel region and the region other than the pixel region.

\* \* \* \* \*